US008487332B2

(12) United States Patent
Aoyama et al.

(10) Patent No.: US 8,487,332 B2
(45) Date of Patent: Jul. 16, 2013

(54) LIGHT-EMITTING DEVICE

(75) Inventors: Tomoya Aoyama, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 147 days.

(21) Appl. No.: 13/093,960

(22) Filed: Apr. 26, 2011

(65) Prior Publication Data

US 2011/0260190 A1 Oct. 27, 2011

(30) Foreign Application Priority Data

Apr. 27, 2010 (JP) ................................. 2010-101933

(51) Int. Cl.
*H01L 33/00* (2010.01)
(52) U.S. Cl.
USPC .............. 257/98; 257/E33.068; 257/E33.069; 257/E51.021
(58) Field of Classification Search
USPC .............. 257/98, E33.068, E33.069, E51.021
See application file for complete search history.

(56) References Cited

U.S. PATENT DOCUMENTS

| 6,337,492 | B1 * | 1/2002 | Jones et al. ...................... 257/40 |
| 7,714,500 | B2 | 5/2010 | Hirakata et al. |
| 7,714,504 | B2 | 5/2010 | Forrest et al. |
| 7,829,907 | B2 * | 11/2010 | Ide et al. .......................... 257/98 |
| 7,999,462 | B2 | 8/2011 | Hirakata et al. |
| 8,368,298 | B2 | 2/2013 | Hirakata et al. |
| 2008/0238308 | A1 * | 10/2008 | So ................................. 313/504 |
| 2009/0167168 | A1 | 7/2009 | Seo et al. |

FOREIGN PATENT DOCUMENTS

| JP | 2005-318296 | 11/2005 |
| JP | 2006-155940 | 6/2006 |

* cited by examiner

*Primary Examiner* — Tan N Tran
(74) *Attorney, Agent, or Firm* — Husch Blackwell LLP

(57) ABSTRACT

Blue organic EL elements, which have a shorter lifetime and lower luminance characteristics than green and red ones, have had a problem: particularly when blue elements are used in a light-emitting device capable of modulating light emission colors, light significantly attenuates and characteristics further deteriorates. A dielectric mirror which is selective in wavelength is provided between organic EL elements, and the number of times especially blue light emission from an organic EL element is transmitted through an electrode having a light-transmitting property is reduced as much as possible, so that attenuation of light is suppressed. Thus, a light-emitting device capable of modulation of light emission colors which has a high luminance and a long lifetime can be provided. In the light-emitting device, voltages applied to the organic EL elements, which deteriorate individually, are separately controlled, whereby the color tone can be kept constant for a long period.

16 Claims, 7 Drawing Sheets

LIGHT-EMITTING DEVICE

BACKGROUND OF THE INVENTION

1. Field of the Invention

The present invention relates to a light-emitting device using a light-emitting element that emits phosphorescence or fluorescence. A disclosed embodiment of the present invention relates to a light-emitting device in which light-emitting elements that emits light having different colors are combined. Note that the term light-emitting device encompasses an image display device, a light-emitting device, and a light source (including a lighting device).

2. Description of the Related Art

In recent years, light-emitting devices which have electroluminescence (hereinafter, referred to as EL) elements using EL as self-luminous light-emitting elements have been actively researched. The light-emitting devices are used for organic EL display devices, organic EL lighting devices, and the like. Such light-emitting devices are also called organic light-emitting diodes. The light-emitting devices provided with EL elements have features suitable for display of moving images, such as high response speed and low-voltage, low-power consumption driving, and thus they have attracting great attention as next-generation display devices such as new-generation mobile phones or personal digital assistants (PDA).

For a light-emitting device in which EL elements are arranged in a matrix, a driving method such as passive (simple) matrix driving or active matrix driving can be used. It is considered that an active matrix type structure in which a switch is provided in each pixel (dot) is advantageous to a device having an increased pixel density, since this structure enables driving at a lower voltage. The EL elements are roughly classified into an inorganic EL element using an inorganic compound and an organic EL element using an organic compound (also referred to as an organic light-emitting element).

Further, an organic compound layer has a stacked-layer structure typified by "a hole-transport layer, a light-emitting layer, and an electron-transport layer". Materials for these layers are roughly classified into low molecular (monomer) materials and high molecular (polymer) materials, and film formation of the low molecular materials is carried out by an evaporation method, for example.

An organic EL element has an anode, a cathode, and the organic compound layer which emits light by application of an electric field. Layers involved in light emission which are included in the stacked-layer structure of the organic compound layer between the anode and the cathode are collectively referred to as an organic EL layer in this specification. As luminescence from an organic compound, light emitted when the compound returns from a singlet excited state to the ground state (fluorescence) and light emitted when the compound returns from a triplet excited state to the ground state (phosphorescence) are known.

Unlike a liquid crystal display device which needs a backlight, an organic EL display device having organic EL elements is a self-luminous device and thus it has excellent visibility due to its capability of easily realizing high contrast and its wide viewing angle. That is, the organic EL display device is more suitable for a display device for outdoor use than a liquid crystal display. A variety of applications of the organic EL display device, such as a display device of a mobile phone or a digital camera, and the like, have been proposed.

Furthermore, with light-emitting elements utilizing electroluminescence, i.e. EL elements, a planar light-emitting device having a large area can be easily formed. This is a feature that is difficult to obtain with point light sources typified by incandescent lamps and LEDs or linear light sources typified by fluorescent lamps. In addition, the light-emitting element is estimated to have higher emission efficiency than incandescent lamps or fluorescent lamps. Therefore, the light-emitting element has attracted attention as a preferable next-generation lighting device.

Further, in an organic EL layer, organic compound layers that emit light having different colors can be stacked: for example, layers that emit light having three primary colors, i.e. red, green, and blue can be stacked to form an organic EL light-emitting device that provides white light emission. This can be used, for example, as a backlight of a liquid crystal panel or as a lighting device. However, since emission characteristics of the colors vary over time individually, such a light-emitting device has a disadvantage that the color tone is changed from the initial one. In order to solve this, techniques are developed in which two organic EL elements each including two electrodes having a light-transmitting property are stacked to mix light emission colors and the voltages applied to the EL elements are separately controlled so that a change in color tone is suppressed. For example, conventional techniques described in Patent Documents 1 and 2 are known. These techniques are applicable to modulation of light emission colors, so that one light source can emit light with different color tones. Since the color of light from a lighting device can thus be changed depending on circumstances, a wide variety of applications including an elaborately designed lighting device have been contemplated. Note that, in the case of the light-emitting device in which organic EL elements whose two electrodes have a light-transmitting property are stacked, since light is emitted from opposite sides of the stacked structure forming the light-emitting device, a reflective plate is provided on one side and the light is extracted from the other side. Instead of an electrode having a light-transmitting property, an electrode having a high property of reflecting visible light rays can be provided as the reflective plate on the backmost part of the light-emitting device, so that the reflective plate can also serve as an electrode.

REFERENCES

Patent Documents

Patent Document 1: Japanese Published Patent Application No. 2005-317296

Patent Document 2: Japanese Published Patent Application No. 2006-155940

SUMMARY OF THE INVENTION

An electrode having a light-transmitting property used for an organic EL element has a disadvantage of a low transmittance to visible light rays. This disadvantage becomes noticeable particularly for short wavelengths, i.e. blue to purple. According to the above references, the device employing a mixture color of two colors has three electrodes having a light-transmitting property and one reflective electrode. Therefore, light reflected by the reflective electrode is transmitted by the electrodes having a light-transmitting property as often as five times at the maximum and then extracted outward. This results in attenuation of the amount of light, which is very remarkable particularly for short-wavelength light whose emission characteristics are originally low. An organic EL element that emits blue light, which is light at a short wavelength, has a shorter lifetime and lower luminance characteristics than an element that emits green or red light. However, without the blue color, a light-emitting device cannot show the color of light emission with good color rendering properties. Therefore, how to manufacture a light-emitting device without attenuation of blue light has been a big challenge.

In view of the above problem, an object of the present invention is to provide a light-emitting device using an organic EL element which has high efficiency and the capability of modulating light emission colors.

A light-emitting device according to one embodiment of the present invention includes a first light-emitting element including a reflective electrode and an electrode having a light-transmitting property, a dielectric mirror, and a second light-emitting element including a pair of electrodes each having a light-transmitting property. The first light-emitting element, the dielectric mirror, and the second light-emitting element are sequentially provided so that the reflective electrode forms an external surface of a structure including the first light-emitting element, the dielectric mirror, and the second light-emitting element. The dielectric mirror transmits light emission from the first light-emitting element and reflects light emission from the second light-emitting element.

The light emission from the first light-emitting element preferably has a longer wavelength than the light emission from the second light-emitting element so as to suppress attenuation of a larger amount of light. An organic EL element or the like can be applied to the light-emitting element. Furthermore, an inorganic EL element can be applied to one embodiment of the present invention, because it has a stacked structure similar to the structure of the organic EL element.

A light-emitting device according to another embodiment of the present invention includes a mirror, a first light-emitting element including a pair of electrodes each having a light-transmitting property, a dielectric mirror, and a second light-emitting element including a pair of electrodes each having a light-transmitting property. The mirror, the first light-emitting element, the dielectric mirror, and the second light-emitting element are sequentially provided. The dielectric mirror transmits light emission from the first light-emitting element and reflects light emission from the second light-emitting element.

A light-emitting device according to another embodiment of the present invention includes a light-emitting diode, a dielectric mirror, and an organic EL element including a pair of electrodes each having a light-transmitting property. The light-emitting diode, the dielectric mirror, and the organic EL light-emitting element are sequentially provided. The dielectric mirror transmits light emission from the light-emitting diode and reflects light emission from the organic EL element.

The light emission from the light-emitting diode preferably has a longer wavelength than the light emission from the organic EL element to suppress attenuation of a larger amount of light.

Although a light-emitting device in which two light-emitting elements are combined is given in the above descriptions of the present invention, the present invention is not limited thereto and encompasses a light-emitting device in which three or more light-emitting elements are combined. Further, instead of the reflective electrode, an electrode having a light-transmitting property may be used with a reflective mirror provided adjacent to the electrode having a light-transmitting property.

In one embodiment of the present invention, the light-emitting diode is classified as an inorganic EL element and seen as a light-emitting element. Furthermore, the expression that a component "has a light-transmitting property" or "is reflective" means that the component can transmit or reflect to light emission from a light-emitting element included in a light-emitting device. When light emission from a light-emitting element is visible light rays, a light-emitting device according to one embodiment of the present invention can be applied to a lighting device or an image display device.

The light-emitting device including an organic EL element according to one embodiment of the present invention has very high efficiency even with the capability of modulating light emission colors. The present invention is effective particularly in a light-emitting device including an organic EL element that emits blue light. Since an organic EL element that emits short-wavelength light has a short lifetime and low emission characteristics as described above, according to one embodiment of the present invention in which attenuation of blue light can be suppressed in a light-emitting device formed to emit light at a plurality of wavelengths, a light-emitting device having a high luminance, a long lifetime, and the capability of modulating light emission colors can be provided. Further, the light-emitting device has a function of separately controlling voltages applied to the organic EL elements to suppress a change in color tone. This feature is particularly effective in a backlight of a liquid crystal panel for which color reproducibility is important, a lighting device for home use, and the like. Furthermore, use of a self-luminous light-emitting element having a light-transmitting property eliminates the need to form a three-dimensional module such as a dichroic mirror used for a three-plate type full color liquid crystal projector, and a board-like structure enables a mixture of colors as in such a projector, according to one embodiment of the present invention.

DETAILED DESCRIPTION OF THE INVENTION

Figure 1:
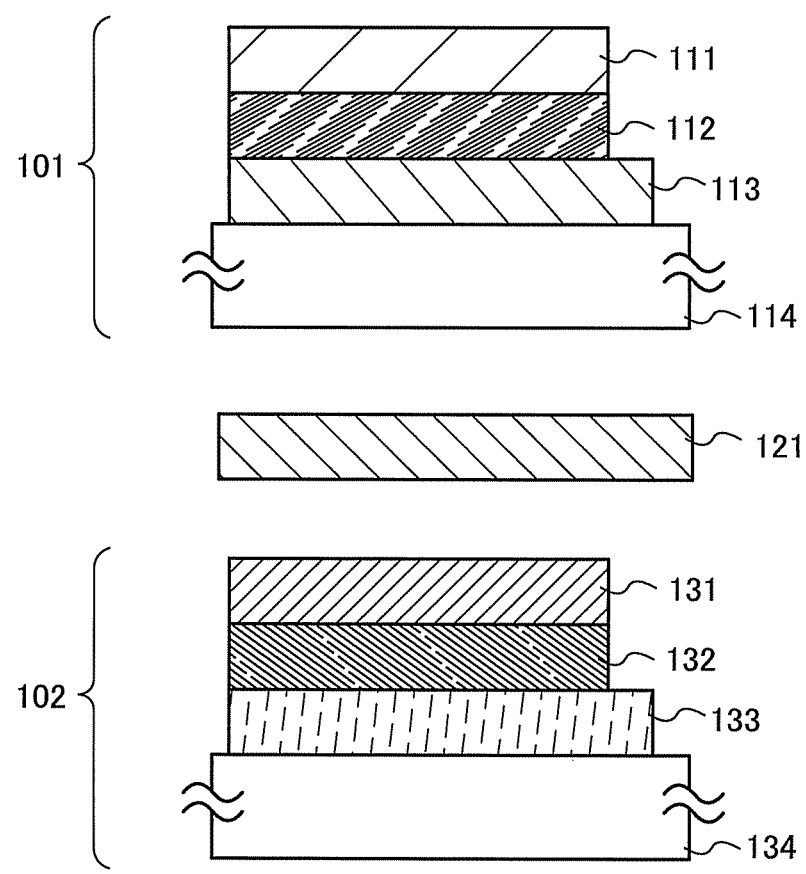
FIG. 1 is a cross-sectional view illustrating an example of a light-emitting device according to one embodiment of the present invention.

Embodiments of the present invention will now be described with reference to the accompanying drawings. Note that the invention is not limited to the description below, and it is easily understood by those skilled in the art that various changes and modifications can be made without departing from the spirit and scope of the invention. Therefore, the invention should not be construed as being limited to the description in Embodiments below. In the structures described below, components common between different drawings might maintain the same reference numerals. Further, the ordinal numbers in this specification do not indicate any order.

Embodiment 1

Figure 2:
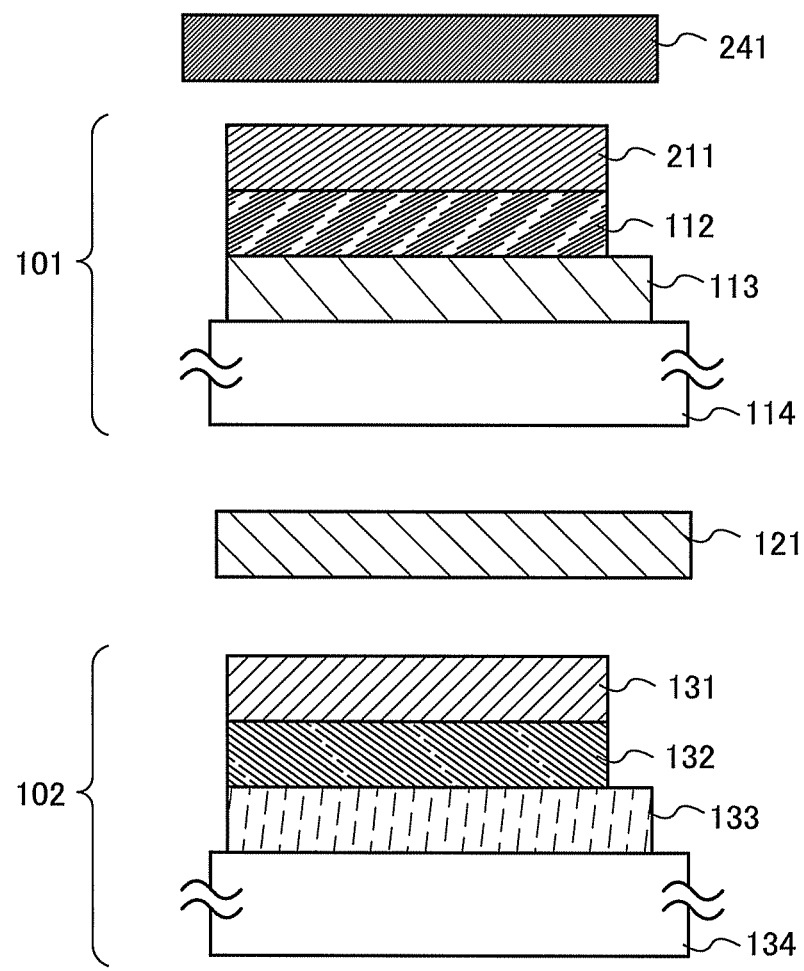
FIG. 2 is a cross-sectional view illustrating an example of a light-emitting device according to one embodiment of the present invention.

A light-emitting device according to one embodiment of the present invention will be described with reference mainly to FIG. 1. FIG. 1 is a cross-sectional view illustrating a basic structure of the light-emitting device. FIG. 2 illustrates an example in which the light-emitting device is partly modified. In this specification, an organic EL element refers to a component that has an organic EL layer serving as a light-emitting region between a pair of electrodes and emits light by application of a voltage between the electrodes. In addition, a light-emitting device refers to a component that emits mixed color light using at least one such organic EL element.

In FIG. 1, a first organic EL element 101 includes a reflective electrode 111, an electrode 113 having a property of transmitting visible light rays, and an organic EL layer 112 therebetween. Further, a second organic EL element 102 includes a pair of electrodes 131 and 133 having a property of transmitting visible light rays, and an organic EL layer 132 therebetween. The first light-emitting element is provided so that the reflective electrode forms an upper surface of the first light-emitting element, the dielectric mirror is provided under the first light-emitting element, and the second light-emitting element is provided under the dielectric mirror. The dielectric mirror 121 transmits light emission from the first organic EL element 101 and reflects light emission from the second organic EL element 102.

Substrates 114 and 134 which are bases of the first organic EL element 101 and the second organic EL element 102 may be used in the light-emitting device, as needed. These substrates may be located on any side of an electrode included in each organic EL element. Further, the substrate of the organic EL element which is located on the side where light is observed needs to have a light-transmitting property. In contrast, this is not necessarily applied to the substrate of the organic EL element which is located in the backmost part opposite to the side where light is observed: the substrate can be a substrate opaque to visible light rays, for example, when provided adjacent to the reflective electrode 111 and examples of a material of such a substrate are ceramic, plastic, metal typified by stainless steel, and the like.

Next, the dielectric mirror 121 will be described. A mirror that is selective in wavelength is generally provided by forming a dielectric multilayer film. The dielectric multilayer film may be provided on the substrate having a light-transmitting property, or may be formed directly on the front side, back side, or both sides of an organic EL element. Thus, design flexibility is very high, and it is possible to select a variety of wavelengths of light, e.g., it is possible to transmit light in one or more wavelength ranges to reflect light in another one or more wavelength ranges. Since the dielectric mirror offers such high flexibility in design, the light-emitting device according to one embodiment of the present invention may be formed in such a manner that three or more organic EL elements are stacked and two or more dielectric mirrors are each interposed between each element. Furthermore, the mirror that is selective in wavelength is not limited to the dielectric mirror, and any component that has similar properties can be applied to one embodiment of the present invention; example of such a component are a photonic crystal and the like.

Next, the reflective electrode 111 will be described. The reflective electrode 111 is preferably formed with a material that has a high reflectance to light at wavelengths emitted from the organic EL elements. Specific examples of the applicable material are metal materials such as aluminum (Al), gold (Au), platinum (Pt), nickel (Ni), tungsten (W), chromium (Cr), molybdenum (Mo), iron (Fe), cobalt (Co), copper (Cu), and palladium (Pd). A stacked-layer structure of such a metal material and any of the following light-transmitting materials may be used: indium tin oxide (ITO); indium tin oxide containing silicon oxide; and indium oxide containing zinc oxide at greater than or equal to 2% and less than or equal to 20%. Note that the material of the reflective electrode 111 is not limited to these materials. Depending on the material, a film thereof is formed by a method such as an evaporation method or a sputtering method. Further, the light-emitting device according to the present invention may have a structure illustrated in FIG. 2, in which an electrode 211 having a light-transmitting property is provided instead of the reflective electrode 111 and a reflective mirror 241 is provided over the electrode 211. A dielectric multilayer metal, a photonic crystal, or the like is used for the reflective mirror 241.

Next, the electrodes 113 131, and 133 each having a light-transmitting property will be described. Examples of the material for the electrodes are indium tin oxide (ITO), aluminum-doped zinc oxide (AZO), and the like. The term "ITO" in this specification refers to indium tin oxide. These electrodes can be formed by a sputtering method, a spin coating method, or the like. Note that the materials for these electrodes transmit little short-wavelength light in particular; therefore, an organic EL element that emits blue or purple light needs to be provided on the side on which light emission goes out, in the light-emitting device according to one embodiment of the present invention. Thus, the number of times emitted blue or purple light is transmitted through the electrodes having a light-transmitting property is reduced, and consequently, the light-emitting device shows very little light attenuation. Even if an electrode having a light-transmitting property has an improved property and acquires a high property of transmitting short-wavelength light, a feature of the light-emitting device of the present invention which is the capability of modulating light emission colors is much more advantageous than an existing technique.

Next, the substrates 114 and 134 will be described. The substrate 134 needs to have a property of transmitting visible light rays, and examples of such a substrate are a quartz substrate, a glass substrate, a plastic substrate, and the like. Since it is important particularly for an organic EL element to shut out the outside air which might cause deterioration, a layer having a high blocking function is preferably formed on a substrate in the case where the substrate is a resin-based substrate typified by a plastic substrate, which is generally said to transmit moisture and air easily. Examples of the layer having a high blocking function are an extremely thin glass substrate having a thickness of 100 µm or less, a film of metal nitride or metal oxide typified by an aluminum oxide film or a silicon nitride film, and the like; any of these layers are preferably stacked to enhance the blocking function. In contrast, the substrate 114 does not need to have a light-transmitting property if provided over the reflective electrode 111, and therefore a material thereof can be selected with drastically improved flexibility. However, the material is not arbitrarily selected and preferably a material having a low thermal expansion coefficient close to that of glass, which is used for a substrate of a liquid crystal panel, and an example of such a material is polyethylenenaphthalate. This is because thermal expansion could possibly cause a crack in or around a light-emitting layer included in an organic EL element. Although a substrate is provided on only one side of an organic EL element in this described example, the invention is not limited thereto and a substrate may be provided on opposite sides or only on the other side of the element.

The organic EL element included in the light-emitting device according to one embodiment of the present invention preferably has a structure in which light emission from the organic EL layer is efficiently extracted outward. An organic EL element having a stacked structure includes layers whose refractive indexes are different from each other, and total reflection of light due to these layers considerably reduces light extraction efficiency. An example where the light extraction efficiency is increased is giving an optical property to a substrate. For example, the substrate is made to have an uneven structure on a surface thereof or have a refractive index distribution, or alternatively, a film sheet or a film having a similar function is formed on the substrate. The size of the uneven structure or the period of the refractive index distribution may be selected as appropriate by a practitioner depending on the purpose. For example, the length of the period is set to correspond to about the wavelength of visible light rays, specifically about 0.5 μm or more, so that total reflection of light can be well suppressed, which is effective in extracting light that enters the surface of the substrate on which an organic EL element is formed, at an angle larger than or equal to the total reflection angle. In contrast, a period of about 0.5 μm or less gives a high property of preventing reflection of nearly perpendicularly incident light and thus is effective in extracting such light. Therefore, in order to extract light emitted at various angles, a substrate is preferably provided with the uneven structure or refractive index distribution which has both periods. Such a structure can be applied not only to the substrate but also to any layer included in an organic EL element. Further, each of these layers is not necessarily uniform, and may have a groove or an opening. Since an electrode having a light-transmitting property, the refractive index of which is particularly high among these layers, is a large factor in the generation of total reflection, a groove or an opening provided in this electrode having a light-transmitting property can significantly increase the light extraction efficiency. With the groove, the opening, or the like, a diffraction grating structure may be formed.

Then, the organic EL layers 112 and 132 will be described. For a mixture of two colors as in the light-emitting device having the structure illustrated in FIG. 1, for example, the color of light emission from the organic EL layer 112 is set to yellow and that of light emission from the organic EL layer 132 is set to blue, so that white light emission can be obtained because of the relationship between the complementary colors. In this case, the dielectric mirror 121 is made to have a property of transmitting yellow light and reflecting blue light. The color of light emission from an organic EL element can be a variety of colors. In the case where two colors that are complementary colors are mixed, a light-emitting device that provides white light emission can be obtained. In this case, the organic EL element that emits light at a shorter wavelength is placed on the side where light is observed. The same is applied to the case where three or more colors are mixed; in this case, the dielectric mirror is made to reflect light emission from the organic EL element(s) that is/are closer to the side where light is observed than the dielectric mirror is, and to transmit light emission from the rest of the organic EL elements. As a material forming the organic EL layers, there can be a wide range of materials; they are not described in this embodiment, but some of the examples thereof will be given in a later embodiment.

By application of the present invention, it is possible to provide a light-emitting device having very high efficiency even with the capability of modulating light emission colors. The present invention is effective particularly in a light-emitting device including an organic EL element that emits blue light. Since an organic EL element that emits short-wavelength light has a short lifetime and low emission characteristics as described above, according to one embodiment of the present invention in which attenuation of blue light can be suppressed in a light-emitting device formed to emit light at a plurality of wavelengths, a light-emitting device having a high luminance, a long lifetime, and the capability of modulating light emission colors can be provided. Further, since organic EL elements included in the light-emitting device are easy to separate, replacement of only the organic EL element that ends its lifetime allows the light-emitting device to be in use for a longer time. Furthermore, use of a self-luminous light-emitting element having a light-transmitting property eliminates the need to form a three-dimensional module such as a dichroic mirror used for a three-plate type full color liquid crystal projector, and a board-like structure enables a mixture of colors as in such a projector, according to the present invention. Effects of these are resource-saving, a weight reduction of a light-emitting device, space-saving, etc. and specifically, savings in personnel costs or material costs due to a considerable reduction in the frequency of replacement of lighting devices in public facilities and the like. Needless to say, the same can be applied to a variety of light-emitting devices for individuals.

This embodiment can be combined with any of the other embodiments given in this specification, as appropriate.

Embodiment 2

Figure 3:
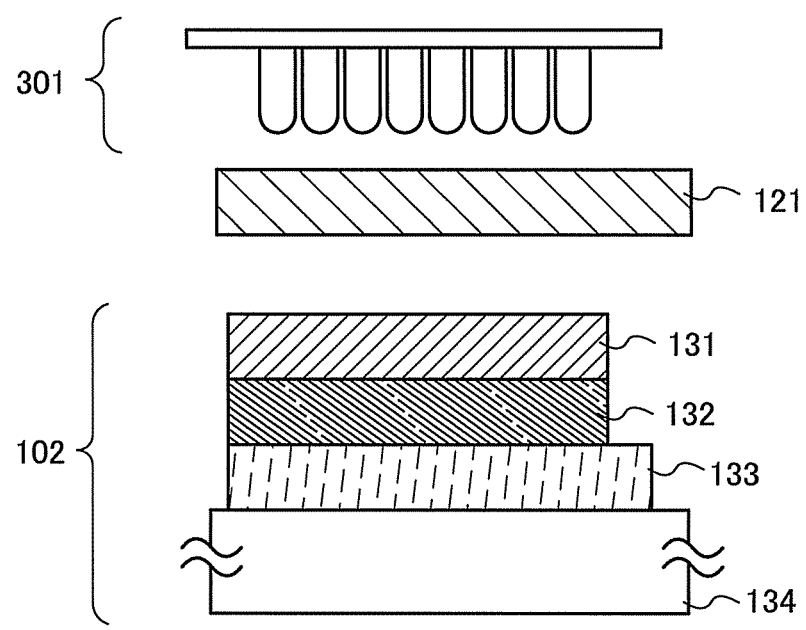
FIG. 3 is a cross-sectional view illustrating an example of a light-emitting device according to one embodiment of the present invention.

A light-emitting device according to one embodiment of the present invention will be described using FIG. 3. FIG. 3 is a cross-sectional view illustrating a basic structure of the light-emitting device including a light-emitting diode and an organic EL element.

In the light-emitting device illustrated in FIG. 3, the first organic EL element 101 illustrated in FIG. 1 is replaced with a light-emitting diode 301. Since the light-emitting diode has a long lifetime which might exceed 100,000 hours, it can provide a light-emitting device having a longer lifetime by being used in combination with the organic EL element. Since the light-emitting diode is nearly a point light source unlike the organic EL element, light with a higher luminance can be obtained by arrangement of light-emitting diodes in a matrix.

Light emission from the light-emitting diodes arranged in a matrix is not limited to having a single color, and can have a variety of colors. The light emission from the light-emitting diodes may have a shorter or longer wavelength than light emission from the organic EL element. In this case, the dielectric mirror 121 is made to transmit light emission from the light-emitting diode 301 and also reflect light emission from the organic EL element 102.

This embodiment can be combined with any of the other embodiments given in this specification, as appropriate.

Embodiment 3

In this embodiment, a method of forming an organic EL element applicable to one embodiment of present invention will be described.

Figure 4A:
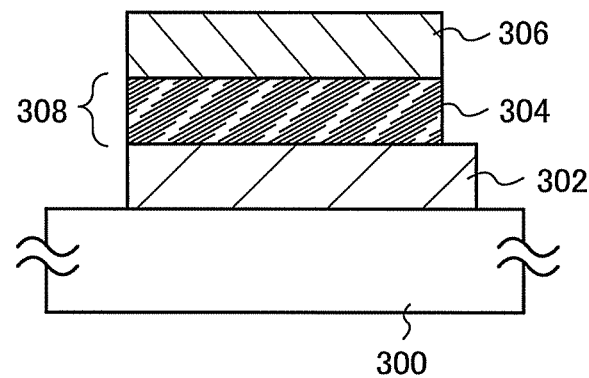
FIGS. 4A and 4B are diagrams illustrating examples of an organic EL element.
Figure 4B:
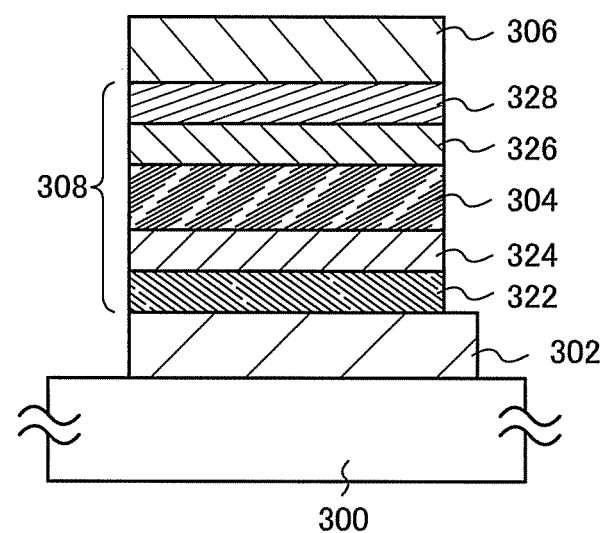

For example, organic EL elements illustrated in FIGS. 4A and 4B can be fabricated. In the organic EL element illustrated in FIG. 4A, a first electrode layer 302, an EL layer 308 which serves as a light-emitting layer 304, and a second electrode layer 306 are sequentially stacked over a substrate 300. One of the first electrode layer 302 and the second electrode layer 306 functions as an anode, and the other functions as a cathode. Holes injected from the anode and electrons injected from the cathode recombine in the light-emitting layer 304, whereby light emission can be obtained. In this embodiment, the first electrode layer 302 functions as an anode and the second electrode layer 306 functions as a cathode.

In the organic EL element illustrated in FIG. 4B, a hole-injection layer, a hole-transport layer, an electron-transport layer, and an electron-injection layer are provided in addition to the above-described structure illustrated in FIG. 4A. The hole-transport layer is provided between the anode and the light-emitting layer. In addition, the hole-injection layer is provided between the anode and the light-emitting layer, or between the anode and the hole-transport layer. Further, the electron-transport layer is provided between the cathode and the light-emitting layer. The electron-injection layer is provided between the cathode and the light-emitting layer or between the cathode and the electron-transport layer. Note that the hole-injection layer, the hole-transport layer, the electron-transport layer, and the electron-injection layer, all of which are not necessarily provided, may be selected as appropriate depending on a required function or the like. In FIG. 4B, the first electrode layer 302 which functions as an anode, a hole-injection layer 322, a hole-transport layer 324, the light-emitting layer 304, an electron-transport layer 326, an electron-injection layer 328, and the second electrode layer 306 which functions as a cathode are sequentially stacked over the substrate 300.

As the substrate 300, a substrate having an insulating surface or an insulating substrate is used, and specific examples that can be used are a variety of glass substrates used in the electronics industry, such as a substrate of aluminosilicate glass, aluminoborosilicate glass, or barium borosilicate glass, a quartz substrate, a ceramic substrate, and a sapphire substrate.

The first electrode layer 302 and the second electrode layer 306 can be formed using any of various types of metals, alloys, and electrically-conductive compounds, a mixture thereof, and the like, and specific examples thereof are indium tin oxide (ITO), indium oxide-tin oxide containing silicon or silicon oxide, indium oxide-zinc oxide (IZO), indium oxide-tin oxide containing tungsten oxide and zinc oxide (IWZO), and the like. Films of these conductive metal oxides are usually formed by sputtering, but may be formed by applying a sol-gel method or the like: for example, a film of indium oxide-zinc oxide (IZO) can be formed by a sputtering method using indium oxide to which 1 wt % to 20 wt % of zinc oxide is added, as a target, and a film of indium oxide containing tungsten oxide and zinc oxide (IWZO) can be formed by a sputtering method using indium oxide containing 0.5 wt % to 5 wt % of tungsten oxide and 0.1 wt % to 1 wt % of zinc oxide, as a target. Other examples are gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), aluminum (Al), silver (Ag), an alloy containing aluminum (e.g., AlSi), and the like. Still other examples that can be used are elements that belong to Groups 1 and 2 in the periodic table, that is, alkali metals such as lithium (Li) and cesium (Cs), alkaline-earth metals such as magnesium (Mg), calcium (Ca), and strontium (Sr), alloys of these elements (e.g., an alloy of aluminum, magnesium, and silver, an alloy of aluminum and lithium), which are materials having a low work function, rare-earth metals such as europium (Eu) and ytterbium (Yb) and alloys thereof, and the like. A film of any of the alkali metals, alkaline-earth metals, and alloys thereof can be formed by a vacuum evaporation method. A film of any of the alloys containing the alkali metals or alkaline-earth metals may be formed by a sputtering method. Furthermore, a film of a silver paste or the like can be formed by an inkjet method or the like. The first electrode layer 302 and the second electrode layer 306 can be formed as a stacked-layer film without being limited to a single-layer film.

In order that light emission from the light-emitting layer 304 be extracted outside, one or both of the first electrode layer 302 and the second electrode layer 306 is/are formed so as to transmit light emission from the light-emitting layer. For example, one or both of them is/are formed using a conductive material having a light-transmitting property, such as indium tin oxide, or using silver, aluminum, or the like to a thickness of several nanometers to several tens of nanometers. One or both of the first electrode layer 302 and the second electrode layer 306 can have a stacked-layer structure including a thin film of metal such as silver or aluminum with a small thickness and a thin film of a conductive material having a light-transmitting property, such as an ITO film. Note that the first electrode layer 302 and the second electrode layer 306 can be formed by any of a variety of methods.

In this embodiment, the light-emitting layer 304, the hole-injection layer 322, the hole-transport layer 324, the electron-transport layer 326, and the electron-injection layer 328 can be formed by any of a variety of methods, examples of which are dry processes such as a vacuum evaporation method, an electron beam evaporation method, and a sputtering method, and wet processes such as an inkjet method, and a spin coating method.

A wide variety of materials can be used for the light-emitting layer 304. For example, a fluorescent compound which exhibits fluorescence or a phosphorescent compound which exhibits phosphorescence can be used.

Examples of the phosphorescent compounds that can be used for the light-emitting layer are the following light-emitting materials: materials that emit blue light such as bis[2-(4', 6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis[2-(3',5'-bistrifluoromethylphenyl)pyridinato-N,$C^{2'}$]iridium(III) picolinate (abbreviation: Ir(CF$_3$ ppy)$_2$(pic)), and bis[2-(4',6'-difluorophenyl)pyridinato-N,$C^{2'}$]iridium(III) acetylacetonate (abbreviation: FIr(acac)); materials that emit green light such as tris(2-phenylpyridinato-N,$C^{2'}$)iridium(III) (abbreviation: Ir(ppy)$_3$), bis(2-phenylpyridinato-N,$C^{2'}$)iridium(III) acetylacetonate (abbreviation: Ir(ppy)$_2$(acac)), bis(1,2-diphenyl-1H-benzimidazolato)iridium(III) acetylacetonate (abbreviation: Ir(pbi)$_2$(acac)), and bis(benzo[h]quinolinato)iridium(III) acetylacetonate (abbreviation: Ir(bzq)$_2$(acac)); materials that emit yellow light such as bis(2,4-diphenyl-1,3-oxazolato-N,$C^{2'}$)iridium(III) acetylacetonate (abbreviation: Ir(dpo)$_2$(acac)), bis[2-(4'-perfluorophenylphenyl)pyridinato]iridium(III) acetylacetonate (abbreviation: Ir(p-PF-ph)$_2$(acac)), and bis(2-phenylbenzothiazolato-N,$C^{2'}$)iridium(III) acetylacetonate (abbreviation: Ir(bt)$_2$(acac)); materials that emit orange light such as tris(2-phenylquinolinato-N,$C^{2'}$)iridium(III) (abbreviation: Ir(pq)$_3$) and bis(2-phenylquinolinato-N,$C^{2'}$)iridium(III) acetylacetonate (abbreviation: Ir(pq)$_2$(acac)); and organometallic complexes as materials that emit red light such as bis[2-(2'-benzo[4,5-α]thienyl)pyridinato-N,C$^{3'}$]iridium(III) acetylacetonate (abbreviation: Ir(btp)$_2$(acac)), bis(1-phenylisoquinolinato-N,C$^{2'}$)iridium(III) acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), and 2,3,7,8,12,13,17,18-octaethyl-21H,23H-porphyrin platinum(II) (abbreviation: PtOEP). Furthermore, any of the following rare-earth metal complexes can be used as a phosphorescent compound since their light emission is generated from a rare-earth metal ion (light emission due to electronic transition between different multiplicities): tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)).

Examples of the fluorescent compounds that can be used for the light-emitting layer are the following light-emitting materials: materials that emit blue light such as N,N'-bis[4-(9H-carbazol-9-yl)phenyl]-N,N'-diphenylstilbene-4,4'-diamine (abbreviation: YGA2S) and 4-(9H-carbazol-9-yl)-4'-(10-phenyl-9-anthryl)triphenylamine (abbreviation: YGAPA); materials that emit green light such as N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',n'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), and N,N,9-triphenylanthracen-9-amine (abbreviation: DPhAPhA); materials that emit yellow light such as rubrene, and 5,12-bis(1,1'-biphenyl-4-yl)-6,11-diphenyltetracene (abbreviation: BPT); and materials that emit red light such as N,N,N',N'-tetrakis(4-methylphenyl)tetracene-5,11-diamine (abbreviation: p-mPhTD), and 7,14-diphenyl-N,N,N',N'-tetrakis(4-methylphenyl)acenaphtho[1,2-a]fluoranthene-3,10-d iamine (abbreviation: p-mPhAFD).

The light-emitting layer 304 may have a structure in which a substance having a high light-emitting property (a dopant material) is dispersed in another substance (a host material). By using the structure in which a substance having a high light-emitting property (a dopant material) is dispersed in another substance (a host material), crystallization of the light-emitting layer can be suppressed. Furthermore, concentration quenching due to the high concentration of the substance having a high light-emitting property can also be suppressed.

As the substance in which the substance having a high light-emitting property is dispersed, a substance having higher singlet excitation energy (the difference in energy between a ground state and a singlet excited state) than the fluorescent compound is preferably used when the substance having a high light-emitting property is a fluorescent compound. When the substance having a high light-emitting property is a phosphorescent compound, a substance having higher triplet excitation energy (the difference in energy between a ground state and a triplet excited state) than the phosphorescent compound is preferably used.

Examples of host materials used for the light-emitting layer are 4,4'-bis[N-(1-naphthyl)-N-phenylamino]biphenyl (abbreviation: NPB), tris(8-quinolinolato)aluminum(III) (abbreviation: Alq$_3$), 4,4'-bis[N-(9,9-dimethylfluoren-2-yl)-N-phenylamino]biphenyl (abbreviation: DFLDPBi), bis(2-methyl-8-quinolinolato)(4-phenylphenolato)aluminum(III) (abbreviation: BAlq), 4,4'-di(9-carbazolyl)biphenyl (abbreviation: CBP), 2-tert-butyl-9,10-di(2-naphthyl)anthracene (abbreviation: t-BuDNA), 9-[4-(9-carbazolyl)phenyl]-10-phenylanthracene (abbreviation: CzPA), and the like.

As the dopant material, any of the above-mentioned phosphorescent compounds and fluorescent compounds can be used.

When the light-emitting layer 304 has the structure in which the substance having a high light-emitting property (the dopant material) is dispersed in another substance (the host material), a co-evaporation method can be used to form the light-emitting layer. For the light-emitting layer, any of the following combinations may be used: two or more kinds of host materials and one or more kinds of dopant materials; two or more kinds of dopant materials and one or more kinds of host materials; and two or more kinds of host materials and two or more kinds of dopant materials.

When the organic EL element illustrated in FIG. 4B is formed in which functional layers are stacked, a procedure for forming a functional layer over a formation substrate can be repeated. Note that when part of the stacked films is formed by an application method, a previously formed layer could possibly be dissolved in a solvent of liquid to be applied; therefore, a practitioner needs to select a suitable formation method as appropriate.

The hole-injection layer 322, the hole-transport layer 324, the electron-transport layer 326, and the electron-injection layer 328 can each be formed using any of a variety of EL materials. Each layer may be formed using one type of material or a composite material of two or more kinds of materials. In addition, the hole-injection layer 322, the hole-transport layer 324, the electron-transport layer 326, and the electron-injection layer 328 may each have a single-layer structure or a stacked-layer structure. For example, the hole-transport layer 324 may have a stacked-layer structure in which a first hole-transport layer and a second hole-transport layer are stacked. In addition, each electrode layer can be formed by a film formation method described above.

For example, the hole-injection layer 322 can be formed using molybdenum oxide, vanadium oxide, ruthenium oxide, tungsten oxide, manganese oxide, a phthalocyanine-based compound such as phthalocyanine (abbreviation: H$_2$Pc) or copper phthalocyanine (abbreviation: CuPc), a high molecule such as poly(3,4-ethylenedioxythiophene)/poly(styrenesulfonate) (PEDOT/PSS), or the like.

As the hole-injection layer 322, a layer that contains a substance having a high hole-transport property and a substance having an electron accepting property can be used. The layer which contains a substance having a high hole-transport property and a substance having an electron-accepting property has a high carrier density and an excellent hole-injection property. When the layer that contains a substance having a high hole-transport property and a substance having an electron-accepting property is used as a hole-injection layer which is in contact with an electrode that functions as an anode, any of various kinds of metals, alloys, electrically conductive compounds, mixtures thereof, and the like can be used as a material of the electrode which functions as an anode regardless of its magnitude of work function.

The layer that contains a substance having a high hole-transport property and a substance having an electron-accepting property can be formed by co-evaporation of a material containing the substance having a high hole-transport property and a material containing the substance having an electron-accepting property, or may be formed by stacking layers of these materials.

Examples of the substance having an electron-accepting property which is used for the hole-injection layer include the following: 7,7,8,8-tetracyano-2,3,5,6-tetrafluoroquinodimethane (abbreviation: F4-TCNQ); chloranil; and the like. Other examples are transition metal oxides. Still other examples are oxides of metals belonging to Groups 4 to 8 of the periodic table. Specifically, vanadium oxide, niobium oxide, tantalum oxide, chromium oxide, molybdenum oxide, tungsten oxide, manganese oxide, and rhenium oxide are preferable because their electron-accepting properties are high. Among them, molybdenum oxide is especially preferable because it is stable also in the atmosphere, has a low hygroscopic property, and can be easily handled.

As the substance having a high hole-transport property used for the hole-injection layer, any of various compounds such as aromatic amine compounds, carbazole derivatives, aromatic hydrocarbons, and high molecular compounds (such as oligomers, dendrimers, and polymers) can be used. Note that it is preferable that the substance having a high hole-transport property used for the hole-injection layer be a substance having a hole mobility of $10^{-6}$ cm$^2$/Vs or more. Note that any other substances that have a hole-transport property which is higher than an electron-transport property may be used. Specific examples of the substance having a high hole-transport property, which can be used for the hole-injection layer, are given below.

Examples of aromatic amine compounds that can be used for the hole-injection layer include the following: 4,4'-bis[N-(1-naphthyl)-N-phenylamino]biphenyl (abbreviation: NPB); N,N'-bis(3-methylphenyl)-N,N'-diphenyl-[1,1'-biphenyl]-4,4'-diamine (abbreviation: TPD); 4,4',4''-tris(N,N-diphenylamino)triphenylamine (abbreviation: TDATA); 4,4',4''-tris[N-(3-methylphenyl)-N-phenylamino]triphenylamine (abbreviation: MTDATA); 4,4'-bis[N-(Spiro-9,9'-billuoren-2-yl)-N-phenylamino]biphenyl (abbreviation: BSPB); and the like. Other examples are as follows: N,N'-bis(4-methylphenyl)(p-tolyl)-N,N'-diphenyl-p-phenylenediamine (abbreviation: DTDPPA); 4,4'-bis[N-(4-diphenylaminophenyl)-N-phenylamino]biphenyl (abbreviation: DPAB); N,N'-bis{4-[3-methylphenyl)amino]phenyl}-N,N'-diphenyl-4',4'-biphenyl}-4,4'-diamine (abbreviation: DNTPD); 1,3,5-tris[N-(4-diphenylaminophenyl)-N-phenylamino]benzene (abbreviation: DPA3B); and the like.

Specific examples of carbazole derivatives that can be used for the hole-injection layer include the following: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like.

Other examples of carbazole derivatives that can be used for the hole-injection layer include the following: 4,4'-di(N-carbazolyl)biphenyl (abbreviation: CBP); 1,3,5-tris[4-(N-carbazolyl)phenyl]benzene (abbreviation: TCPB); 9-[4-(10-phenyl-9-anthryl)phenyl]-9H-carbazole (abbreviation: CzPA); 1,4-bis-[4-(N-carbazolyl)phenyl]-2,3,5,6-tetraphenylbenzene; and the like.

Examples of aromatic hydrocarbons that can be used for the hole-injection layer include the following: 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-bis(4-phenylphenyl)anthracene (abbreviation: t-BuDBA), 9,10-di(2-naphthyl)anthracene (abbreviation: DNA); 9,10-diphenylanthracene (abbreviation: DPAnth), 2-tert-butylanthracene (abbreviation: t-BuAnth); 9,10-bis(4-methyl-1-naphthyl)anthracene (abbreviation: DMNA); 9,10-bis[2-(1-naphthyl)phenyl]-2-tert-butylanthracene, 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthiyl, 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl;

anthracene; tetracene; rubrene; perylene; 2,5,8,11-tetra(tert-butyl)perylene; and the like. Besides, pentacene, coronene, and the like can also be given. As these aromatic hydrocarbons listed here, it is preferable that an aromatic hydrocarbon having a hole mobility of $1 \times 10^{-6}$ cm$^2$/Vs or more and having 14 to 42 carbon atoms be used.

Note that an aromatic hydrocarbon that can be used for the hole-injection layer may have a vinyl skeleton. Examples of aromatic hydrocarbons having a vinyl group include the following: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like are given.

In addition, the layer which contains a substance having a high hole-transport property and a substance having an electron-accepting property is excellent in not only a hole-injection property but also in a hole-transport property, and thus the above-described hole-injection layer may be used as the hole-transport layer.

The hole-transport layer 324 is a layer which contains a substance having a high hole-transport property. Examples of the substance having a high hole-transport property include aromatic amine compounds such as 4,4'-bis[N-(1-naphthyl)-N-phenylamino]biphenyl (abbreviation: NPB), N,N-bis(3-methylphenyl)-N,N'-diphenyl-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), and the like. The substances listed here mainly have a hole mobility of $10^{-6}$ cm$^2$/Vs or more. Note that any other materials that have a hole-transport property which is higher than an electron-transport property may be used. The layer which contains a substance having a high hole-transport property is not limited to a single layer and may be a stacked layer including two or more layers formed using the above-mentioned substances.

The electron-transport layer 326 is a layer which contains a substance having a high electron-transport property. Examples of the substance having a high electron-transport property include metal complexes having a quinoline skeleton or a benzoquinoline skeleton, such as tris(8-quinolinolato)aluminum (abbreviation: Alq$_3$), tris(4-methyl-8-quinolinolato)aluminum (abbreviation: Almq$_3$), bis(10-hydroxybenzo[h]quinolinato)beryllium (abbreviation: BeBq$_2$), bis(2-methyl-8-quinolinolato)(4-phenylphenolato)aluminum (abbreviation: BAlq), and the like. Other examples are metal complexes having an oxazole-based or a thiazole-based ligand, such as bis[2-(2-hydroxyphenyl)benzoxazolato]zinc (abbreviation: Zn(BOX)$_2$) and bis[2-(2-hydroxyphenyl)-benzothiazolato]zinc (abbreviation: Zn(BTZ)$_2$), and the like. Besides the metal complexes, other examples are as follows: 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl]benzene (abbreviation: OXD-7); 3-(4-biphenylyl)-4-phenyl-5-(4-tert-butylphenyl)-1,2,4-triazole (abbreviation: TAZ01); bathophenanthroline (abbreviation: BPhen), bathocuproine (abbreviation: BCP); and the like. The substances described here are mainly substances having an electron mobility of $10^{-6}$ cm$^2$/Vs or more. Note that other than the above substances, any substance that has a property of transporting more electrons than holes may be used for the electron-transport layer. Further, the electron-transport layer is not limited to a single layer, and may be a stack of two or more layers containing any of the above substances.

The electron-injection layer 328 can be formed using an alkali metal compound or an alkaline-earth metal compound, such as lithium fluoride (LiF), cesium fluoride (CsF), or calcium fluoride ($CaF_2$). Furthermore, a layer in which a substance having an electron-transport property is combined with an alkali metal or an alkaline-earth metal can be employed. For example, a layer of $Alq_3$ containing magnesium (Mg) can be used. Note that it is preferable that the layer in which a substance having an electron-transport property is combined with an alkali metal or an alkaline-earth metal be used as the electron-injection layer because electrons are efficiently injected from the second electrode layer 306.

Note that there is no particular limitation on the stacked-layer structure of layers of the organic EL layer 308. The organic EL layer 308 may be formed with an appropriate combination of a light-emitting layer with any of layers which contain a substance having a high electron-transport property, a substance having a high hole-transport property, a substance having a high electron-injection property, a substance having a high hole-injection property, a bipolar substance (a substance having high electron and hole-transport properties), and the like.

Light emission is extracted to the outside through one or both of the first and the second electrode layers 302 and 306. Therefore, one or both of the first and the second electrode layers 302 and 306 is/are an electrode having a light-transmitting property. In the case where only the first electrode layer 302 is an electrode having a light-transmitting property, light is extracted from the substrate 300 side through the first electrode layer 302. In the case where only the second electrode layer 306 is an electrode having a light-transmitting property, light is extracted from the side opposite to the substrate 300 side through the second electrode layer 306. In the case where both the first electrode layer 302 and the second electrode layer 306 are electrodes having light-transmitting properties, light is extracted from both the substrate 300 side and the side opposite to the substrate 300 side through the first electrode layer 302 and the second electrode layer 306.

Figure 5A:
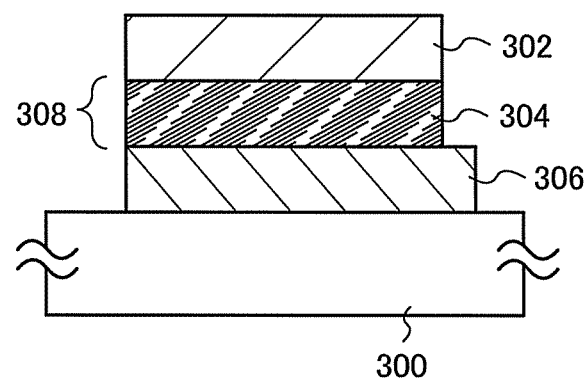
FIGS. 5A and 5B are diagrams illustrating examples of an organic EL element.
Figure 5B:
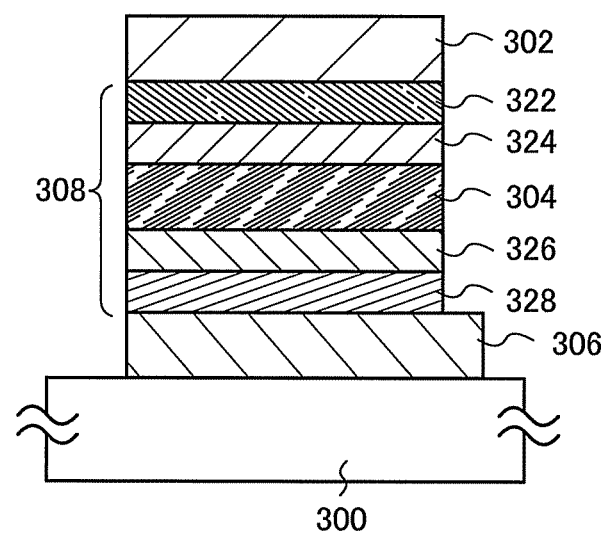

Note that although FIGS. 4A and 4B each illustrate a structure in which the first electrode layer 302 functioning as an anode is provided on the substrate 300 side, the second electrode layer 306 functioning as a cathode, the organic EL layer 308, and the first electrode layer 302 serving as an anode may be sequentially stacked over the substrate 300 as illustrated in FIG. 5A. Alternatively, the second electrode layer 306 functioning as a cathode, the electron-injection layer 328, the electron-transport layer 326, the light-emitting layer 304, the hole-transport layer 324, the hole-injection layer 322, and the first electrode layer 302 functioning as an anode may be sequentially stacked over the substrate 300 as illustrated in FIG. 5B.

A different formation method may be employed for each electrode or each layer. Examples of dry processes include a vacuum evaporation method, an electron beam evaporation method, sputtering, and the like. Examples of wet processes include an inkjet method, a spin coating method, and the like.

Further, sealing is performed using a sealant such as a sealant can or a glass substrate for sealing, if necessary. Here, a glass substrate is used as a sealing substrate, and a substrate and the sealing substrate are attached to each other with use of an adhesive such as a sealing material to seal a space surrounded by the adhesive such as a sealing material. The space that is sealed is filled with a filler or a dried inert gas. Note that an epoxy-based resin is preferably used as the sealant. A material used for these is desirably a material that does not transmit moisture or oxygen as possible. As a material used for the sealing substrate, a glass substrate, a quartz substrate, or a plastic substrate formed of FRP (fiberglass reinforced plastic), PVF (polyvinyl fluoride), a polyester film, polyester, acrylic, or the like can be used. In addition, a desiccant or the like may be put between the substrate and the sealant so that reliability of the light-emitting device is increased. The desiccant removes a minute amount of moisture, thereby achieving sufficient desiccation. For the desiccant, a substance that adsorbs moisture by chemical adsorption such as oxide of alkaline-earth metal such as calcium oxide or barium oxide can be used. Other than the these, a substance that adsorbs moisture by physical adsorption such as zeolite or silicagel may be used.

The desiccant is not necessarily provided, in the case where a sealant is provided in contact with and covering the organic EL element and the outside air is sufficiently shut out.

Through the above-described steps, the organic EL element can be fabricated. The organic EL element according to this embodiment can be used for a light-emitting device of the present invention.

This embodiment can be combined with any of the other embodiments given in this specification, as appropriate.

Embodiment 4

In this embodiment, an example of a method of forming the organic EL elements 101 and 102 illustrated in FIG. 1 will be described. Here, an example of the manufacture of a light-emitting device that provides white light emission in which the organic EL element 101 is a light-emitting element that emits yellow light and the organic EL element 102 is a light-emitting element that emits blue light will be given.

First, an example of a method of fabricating the organic EL element 101 will be given. Here, a method of fabricating a bottom-emitting light-emitting element that emits yellow light will be described. To begin with, a glass substrate provided with the electrode 113 serving as an anode is prepared. The electrode 113 is a 110-nm-thick film of indium tin oxide containing silicon oxide (ITSO). A surface of the electrode 113 is covered with a polyimide film having a 2 mm square opening, so that the electrode area is 2 mm×2 mm. Then, the glass substrate is washed with water and baked at 200° C. for one hour, and then UV ozone treatment is performed for 370 seconds. Then, the glass substrate is introduced into a vacuum evaporation apparatus in which the pressure is reduced to about $10^{-5}$ Pa. In a heating chamber of the vacuum evaporation apparatus, heating is performed at 170° C. for 30 minutes. After that, the glass substrate is cooled down for about 30 minutes.

Next, the glass substrate is fixed to a substrate holder in the vacuum evaporation apparatus so that the electrode 113 is located below.

Then, 4-phenyl-4'-(9-phenylfluoren-9-yl)triphenylamine (abbreviation: BPAFLP) and molybdenum(VI) oxide are co-evaporated on the electrode 113, whereby a first layer in which molybdenum oxide, which is an electron-accepting compound, is added to BPAFLP is formed to a thickness of 50 nm. Resistive heating is employed for the evaporation. The evaporation rate is controlled such that the weight ratio of BPAFLP to molybdenum(VI) oxide is 1:0.5 (=BPAFLP:molybdenum(VI) oxide). Note that the co-evaporation refers to an evaporation method in which evaporation is carried out from different evaporation sources at the same time in one process chamber.

Next, a second layer is formed with BPAFLP to a thickness of 30 nm by an evaporation method using resistance heating.

Then, 2-[4-(3,6-diphenyl-9H-carbazol-9-yl)phenyl]-3-phenylquinoxaline (abbreviation: Cz1PQ-III), 4-phenyl-4'-(9-phenyl-9H-carbazol-3-yl)triphenylamine (abbreviation: PCBA1BP), and (acetylacetonato)bis[5-isopropyl-2,3-bis(4-fluorophenyl)pyrazinato]iridium(III) (abbreviation: Ir(Fdppr-iPr)$_2$(acac)) are co-evaporated to form a first light-emitting layer including Cz1PQ-III, PCBA1BP which has a higher hole-transport property than Cz1PQ-III, and Ir(Fdppr-iPr)$_2$(acac) which corresponds to a first light-emitting substance that emits yellow light. The thickness of the first light-emitting layer is 30 nm, and the evaporation rate is controlled such that the weight ratio of Cz1PQ-III to PCBA 1 BP and Ir(Fdppr-iPr)$_2$(acac) is 1:0.1:0.06 (=Cz1PQ-III:PCBA1BP:Ir(Fdppr-iPr)$_2$(acac)).

Next, a fourth layer is formed with Cz1PQ-III to a thickness of 10 nm by an evaporation method using resistance heating.

Next, an electron-transport layer is formed with bathophenanthroline (abbreviation: BPhen) to a thickness of 15 nm. Then, an electron-injection layer is formed with lithium fluoride to a thickness of 1 nm.

Lastly, the reflective electrode 111 serving as a cathode is formed with aluminum to a thickness of 200 nm by an evaporation method using resistance heating. The organic EL element 101 is thus formed.

First, an example of a method of fabricating the organic EL element 102 will be given. Here, a method of fabricating a bottom-emitting light-emitting element that emits blue light will be described. To begin with, a glass substrate provided with the electrode 133 serving as an anode is prepared. The electrode 133 is a 110-nm-thick film of indium tin oxide containing silicon oxide (ITSO). A surface of the electrode 133 is covered with a polyimide film having a 2 mm square opening, so that the electrode area is 2 mm×2 mm. Then, the glass substrate is washed with water and baked at 200° C. for one hour, and then UV ozone treatment is performed for 370 seconds. Then, the glass substrate is introduced into a vacuum evaporation apparatus where the pressure is reduced to about $10^{-5}$ Pa. In a heating chamber of the vacuum evaporation apparatus, heating is performed at 170° C. for 30 minutes. After that, the glass substrate is cooled down for about 30 minutes.

Next, the glass substrate is fixed to a substrate holder in the vacuum evaporation apparatus so that the electrode 133 is located below.

Then, 9-phenyl-3-[4-(10-phenyl-9-anthryl)phenyl]-9H-carbazole (abbreviation: PCzPA) and molybdenum(VI) oxide are co-evaporated on the electrode 133, whereby a first layer in which molybdenum oxide which is an electron-accepting compound is added to PCzPA is formed to a thickness of 50 nm. Resistive heating is employed for the evaporation. The evaporation rate is controlled such that the weight ratio of PCzPA to molybdenum(VI) oxide is 1:0.5 (=PCzPA:molybdenum(VI) oxide). Note that the co-evaporation refers to an evaporation method in which different substances are evaporated from the respective different evaporation sources at the same time in one process chamber.

Next, a second layer is formed with PCzPA to a thickness of 30 nm by an evaporation method using resistance heating.

Then, PCzPA and N,N'-bis[4-(9-phenyl-9H-fluoren-9-yl)phenyl]-N,N'-diphenylpyrene-1,6-diamine (abbreviation: 1,6FLPAPrn) are co-evaporated to form a first light-emitting layer including PCzPA and 1,6FLPAPrn, which corresponds to a first light-emitting substance having a hole-trapping property with respect to PCzPA, to a thickness of 20 nm. The evaporation rate is controlled such that the weight ratio of PCzPA to 1,6FLPAPrn is 1:0.05 (=PCzPA:1,6FLPAPm).

Further, 9-[4-(10-phenyl-9-anthryl)phenyl]-9H-carbazole (abbreviation: CzPA) and 1,6FLPAPm were co-evaporated to form a second light-emitting layer including CzPA and 1,6FLPAPm, which corresponds to a second light-emitting substance having a hole-trapping property with respect to CzPA, to a thickness of 25 nm. The evaporation rate is controlled such that the weight ratio of CzPA to 1,6FLPAPm is 1:0.05 (=CzPA:1,6FLPAPrn).

A layer of tris(8-quinolinolato)aluminum(III) (abbreviation: Alq$_a$) is formed to a thickness of 10 nm, and thereon, a mixed film of bathophenanthroline (abbreviation: BPhen) and metallic lithium (Li) which is obtained by co-evaporation is stacked, whereby the electron-transport layer is formed. The thickness of the electron-transport layer 413 is 15 nm, and the evaporation rate is controlled such that the weight ratio of BPhen to Li is 1:0.01 (=BPhen:Li).

Lastly, the electrode 131 serving as a cathode is formed with ITO to a thickness of 70 nm by a sputtering method. The organic EL element 102 is thus formed.

A substrate having a dielectric mirror that reflects 50 or more percent of light at a wavelength less than or equal to 490 nm is fixed, with the use of resin, between the organic EL elements 101 and 102 which are fabricated by the above-described method, whereby the light-emitting device is completed.

This embodiment can be combined with any of the other embodiments given in this specification, as appropriate.

Embodiment 5

In this embodiment, a variety of electronic devices completed by a light-emitting device fabricated according to the present invention will be described with reference to FIGS. 6A to 6E and FIGS. 7A to 7C.

Examples of electronic devices to which the light-emitting device according to one embodiment of the present invention is applied are televisions, cameras such as video cameras or digital cameras, goggle type display devices (head-mounted display devices), navigation systems, audio playback devices (e.g., car audio systems and audio systems), notebook computers, game machines, portable information terminals (e.g., mobile computers, mobile phones, smartphones, portable game machines, and electronic books), image playback devices in which a recording medium is provided (devices that are capable of playing back recording media such as digital versatile discs (DVDs) and equipped with a display device that can display an image), lighting devices, and the like. Some specific examples of these electronic devices are illustrated in FIGS. 6A to 6E and FIGS. 7A to 7C.

Figure 6A:
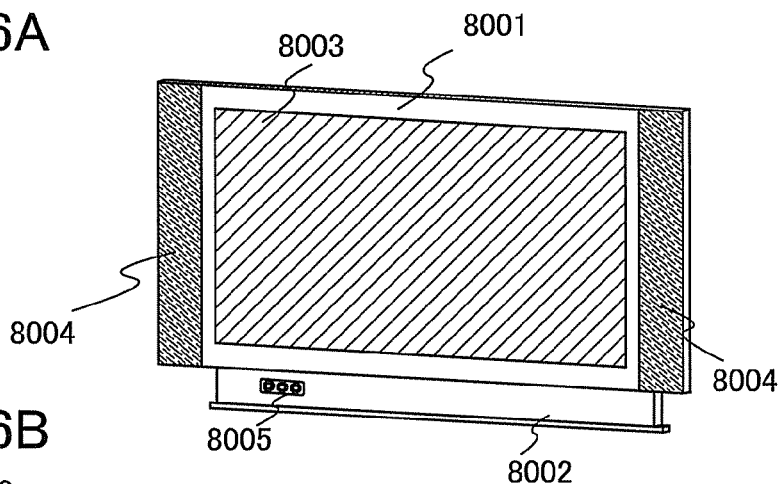
FIGS. 6A to 6E are diagrams illustrating examples of electronic devices.

FIG. 6A illustrates a display device, which includes a housing 8001, a supporting base 8002, a display portion 8003, a speaker portion 8004, video input terminals 8005, and the like. The display device is manufactured using a light-emitting device according to the present invention for a backlight of the display portion 8003 or the like. Note that the display device includes all devices for displaying information, for example, for a personal computer, for receiving TV broadcasting, and for displaying an advertisement. By application of the present invention, a display device whose image quality does not deteriorate for a long period can be obtained. The present invention is effective particularly in a display device whose backlight is a light-emitting device including an organic EL element that emits blue light. Since an organic EL element that emits short-wavelength light has a short lifetime and low emission characteristics, a display device having a high luminance and a long lifetime can be provided according to one embodiment of the present invention in which attenuation of blue light can be suppressed in a light-emitting device formed to emit light at a plurality of wavelengths. Further, since organic EL elements included in a light-emitting device are easy to separate, replacement of only the organic EL element that ends its lifetime allows the light-emitting device to be in use for a longer time. Consequently, the frequency of replacement of display devices in public facilities and the like can be considerably reduced, which leads to savings in personnel costs or material costs. Needless to say, the same can be applied to a variety of display devices for individuals.

Figure 6B:
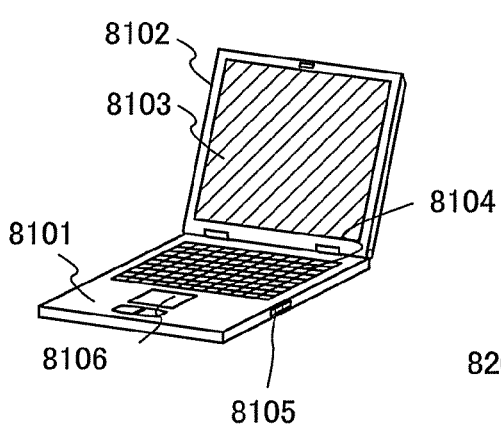

FIG. 6B illustrates a computer, which includes a main body 8101, a housing 8102, a display portion 8103, a keyboard 8104, an external connecting port 8105, a pointing device 8106, and the like. The manufactured computer is manufactured using a light-emitting device according to the present invention for a backlight of the display portion 8103. By application of the present invention, the same effect as that of the above display device can be obtained. Thus, a display portion whose image quality does not deteriorate for a long period can be provided for the computer.

Figure 6C:
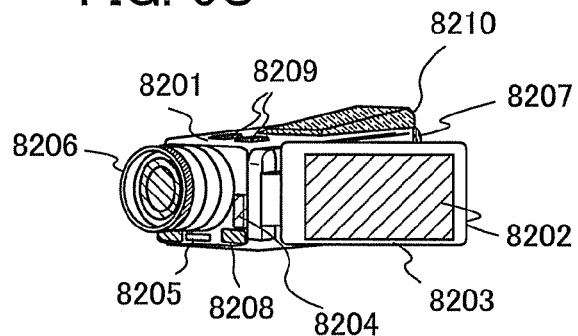

FIG. 6C illustrates a video camera, which includes a main body 8201, a display portion 8202, a housing 8203, an external connecting port 8204, a remote control receiving portion 8205, an image receiving portion 8206, a battery 8207, an audio input portion 8208, an operation key 8209, an eyepiece portion 8210, and the like. The manufactured computer is manufactured using a light-emitting device according to the present invention for a backlight of the display portion 8202. By application of the present invention, a display portion whose image quality does not deteriorate for a long period can be provided for the video camera. Effects of this are, for example, resource-saving and the like due to significant suppression of deterioration of the display portion.

Figure 6D:
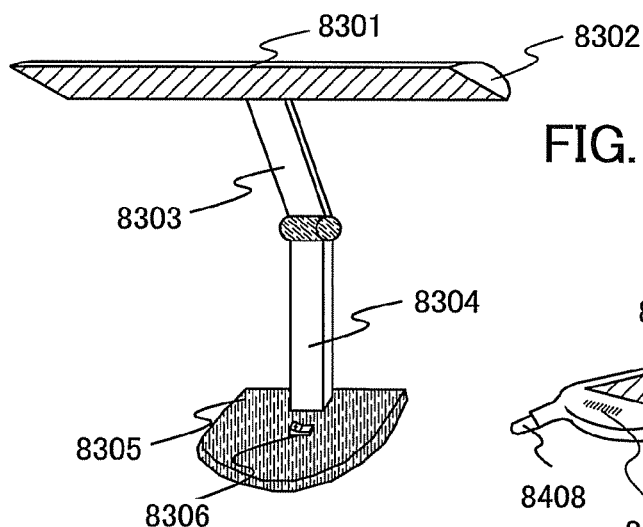

FIG. 6D illustrates a desk lamp, which includes a lighting portion 8301, a shade 8302, an adjustable arm 8303, a support 8304, a base 8305, a power supply switch 8306, and the like. Note that the desk lamp is manufactured using a light-emitting device according to the present invention for the lighting portion 8301. Note that the lighting device includes a ceiling light, a wall light, and the like in its category. By application of the present invention, a lighting device in which brightness is kept and the color tone is not changed for a long period can be obtained. Effects of this are, for example, savings in personnel costs and resources due to a considerable reduction in the frequency of replacement of the lighting device, and the like. The color tone can be freely changed in this lighting device, and therefore it can be applied to an elaborately designed lighting device and the like.

Figure 6E:
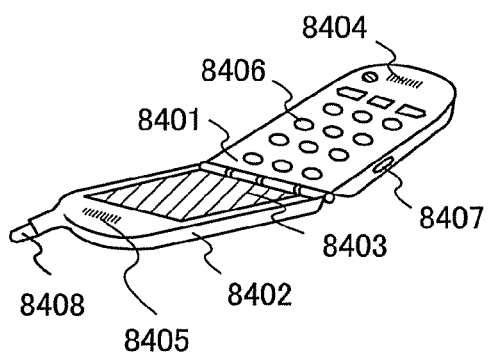

FIG. 6E illustrates a mobile phone including a main body 8401, a housing 8402, a display portion 8403, an audio input portion 8404, an audio output portion 8405, operation keys 8406, an external connection port 8407, an antenna 8408, and the like. The mobile phone is manufactured using a light-emitting device according to the present invention for a backlight of the display portion 8403. By application of the present invention, a display portion whose image quality does not deteriorate for a long period can be provided for the mobile phone. Effects of this are, for example, savings in personnel costs and resources due to a considerable reduction in the frequency of replacement of the mobile phone needed by deterioration of the display portion, and the like.

Figure 7A:
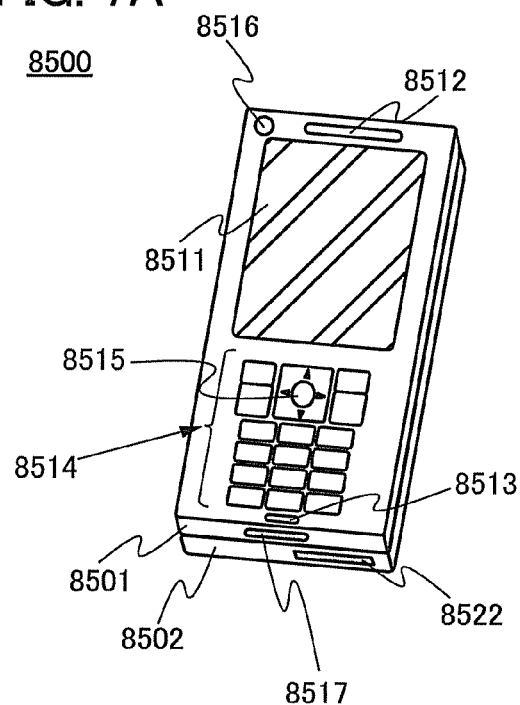
FIGS. 7A to 7C are diagrams illustrating examples of electronic devices.
Figure 7B:
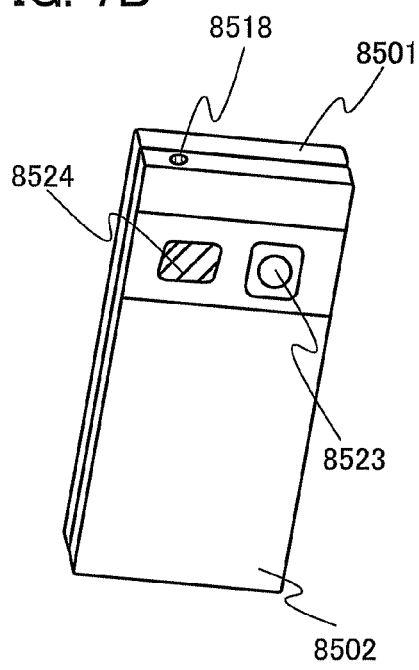
Figure 7C:
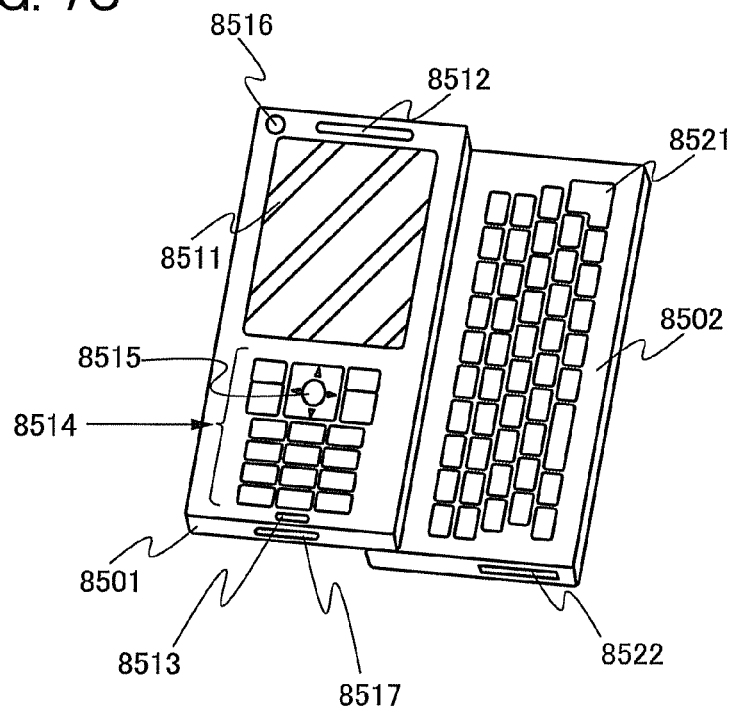

FIGS. 7A to 7C illustrate a mobile phone 8500 which is another example of the mobile phone according to the present invention. FIG. 7A is a front view, FIG. 7B is a rear view, and FIG. 7C is a development view. The mobile phone 8500 is a so-called smartphone having both functions of a mobile phone and a portable information terminal, which incorporates a computer and can process a variety of data processing in addition to voice calls.

The mobile phone 8500 has two housing: a housing 8501 and a housing 8502. The housing 8501 includes a display portion 8511, a speaker 8512, a microphone 8513, operation keys 8514, a pointing device 8515, a camera lens 8516, an external connection terminal 8517, and the like. The housing 8502 includes a keyboard 8521, an external memory slot 8522, a camera lens 8523, a light 8524, an earphone terminal 8518, and the like. In addition, an antenna is built in the housing 8501. In the mobile phone 8500, a light-emitting device according to the present invention is used for a backlight of the display portion 8511.

In addition to the above-described structure, a wireless IC chip, a small size memory device, or the like can be built therein.

The display portion 8511 has a function of changing the orientation of the display appropriately depending on a usage pattern. The camera lens 8516 is provided in the same plane as the display portion 8511, so that video calls can be made. Further, with the display portion 8511 used as a viewfinder, the camera lens 8523 and the light 8524 can be used to take still images and moving images. The speaker 8512 and the microphone 8513 can be used not only for voice calls but also for video calls, record and playback of sound, and the like. The operation keys 8514 enable transmission and reception of calls, input of information such as e-mail, scroll on the screen, movement of the cursor, and the like. Furthermore, the housing 8501 and the housing 8502 (FIG. 7A), which overlap each other, have a slide function, so that they can be unfolded as illustrated in FIG. 7C and used as a portable information terminal. At this time, the keyboard 8521 and the pointing device 8515 are used to realize smooth operation. The external connection terminal 8517 can be connected to an AC adaptor and various types of cables such as a USB cable, so that charging, data communication with a personal computer, or the like can be carried out. Moreover, a storage medium can be inserted into the external memory slot 8522.

In addition to the above functions, the mobile phone may include a wireless communication function, a television reception function, or the like.

By application of the present invention to the mobile phone 8500, a display portion whose image quality does not deteriorate for a long period can be obtained. Effects of this are, for example, savings in personnel costs and resources due to a considerable reduction in the frequency of replacement of the mobile phone needed by deterioration of the display portion, and the like.

In the above-described manner, electronic devices or lighting devices can be obtained by application of a light-emitting device according to one embodiment of the present invention. Application range of the light-emitting device according to one embodiment of the present invention is so wide that the light-emitting device can be applied to electronic devices in a variety of fields.

This embodiment can be combined with any of the other embodiments given in this specification, as appropriate.

This application is based on Japanese Patent Application serial no. 2010-101933 filed with the Japan Patent Office on Apr. 27, 2010, the entire contents of which are hereby incorporated by reference.

What is claimed is:

1. A light-emitting device comprising:
a first light-emitting element including a reflective electrode and an electrode having a light-transmitting property, the first light-emitting element over a first substrate;
a dielectric mirror comprising a first dielectric multilayer film over a second substrate; and
a second light-emitting element including a pair of electrodes each having a light-transmitting property, the second light-emitting element over a third substrate,
wherein the first light-emitting element is provided so that the reflective electrode forms an upper surface of the first light-emitting element,
wherein the dielectric mirror is provided under the first light-emitting element with a first space interposed therebetween,
wherein the second light-emitting element is provided under the dielectric mirror with a second space interposed therebetween,
wherein the dielectric mirror transmits a first light from the first light-emitting element and reflects a second light from the second light-emitting element, and
wherein the dielectric mirror reflects 50 or more percent of light at a wavelength less than or equal to 490 nm.

2. The light-emitting device according to claim 1, wherein at least one of the first light-emitting element and the second light-emitting element is an organic light-emitting element.

3. The light-emitting device according to claim 1, wherein the first light has a longer wavelength than the second light.

4. The light-emitting device according to claim 1, wherein the first light is emitted through the dielectric mirror and the second light-emitting element.

5. The light-emitting device according to claim 1, wherein the first space and the second space are filled with a resin.

6. The light-emitting device according to claim 1, further comprising a second dielectric multilayer film on a bottom surface of the first substrate.

7. A light-emitting device comprising:
a mirror;
a first light-emitting element including a pair of electrodes each having a light-transmitting property, the first light-emitting element over a first substrate;
a dielectric mirror comprising a first dielectric multilayer film over a second substrate; and
a second light-emitting element including a pair of electrodes each having a light-transmitting property, the second light-emitting element over a third substrate,
wherein the first light-emitting element is provided under the mirror,
wherein the dielectric mirror is provided under the first light-emitting element with a first space interposed therebetween,
wherein the second light-emitting element is provided under the dielectric mirror with a second space interposed therebetween,
wherein the dielectric mirror transmits a first light from the first light-emitting element and reflects a second light from the second light-emitting element, and
wherein the dielectric mirror reflects 50 or more percent of light at a wavelength less than or equal to 490 nm.

8. The light-emitting device according to claim 7, wherein at least one of the first light-emitting element and the second light-emitting element is an organic light-emitting element.

9. The light-emitting device according to claim 7, wherein the first light t has a longer wavelength than the second light.

10. The light-emitting device according to claim 7, wherein the first light is emitted through the dielectric mirror and the second light-emitting element.

11. The light-emitting device according to claim 7, wherein the first space and the second space are filled with a resin.

12. The light-emitting device according to claim 7, further comprising a second dielectric multilayer film on a bottom surface of the first substrate.

13. A light-emitting device comprising:
a light-emitting diode under a first substrate;
a dielectric mirror comprising a first dielectric multilayer film over a second substrate; and
an organic light-emitting element including a pair of electrodes each having a light-transmitting property, the organic light-emitting element over a third substrate,
wherein the dielectric mirror is provided under the light-emitting diode with a first space interposed therebetween,
wherein the organic light-emitting element is provided under the dielectric mirror with a second space interposed therebetween, and
wherein the dielectric mirror transmits a first light from the light-emitting diode and reflects a second light from the organic light-emitting element, and
wherein the dielectric mirror reflects 50 or more percent of light at a wavelength less than or equal to 490 nm.

14. The light-emitting device according to claim 13, wherein the first light t has a longer wavelength than the second light.

15. The light-emitting device according to claim 13, wherein the first light is emitted through the dielectric mirror and the organic light-emitting element.

16. The light-emitting device according to claim 13, wherein the first space and the second space are filled with a resin.

* * * * *

UNITED STATES PATENT AND TRADEMARK OFFICE
CERTIFICATE OF CORRECTION

| | |
|---|---|
| PATENT NO. | : 8,487,332 B2 |
| APPLICATION NO. | : 13/093960 |
| DATED | : July 16, 2013 |
| INVENTOR(S) | : Tomoya Aoyama and Satoshi Seo |

It is certified that error appears in the above-identified patent and that said Letters Patent is hereby corrected as shown below:

In the Specification:

Column 6, line 24; Change "dielectric multilayer metal," to --dielectric multilayer film, metal,--.
Column 11, line 30; Change "-N,N',n'-triphenyl" to --N,N',N'-triphenyl--.
Column 13, line 34; Change "[N-(Spiro-9,9'-billuoren-" to --[N-(spiro-9,9'-bifluoren- --.
Column 13, line 40; Change "diphenyl-4',4'" to --diphenyl-1,1'- --.
Column 14, line 5; Change "9,9'-bianthiyl," to --9,9'-bianthryl,--.
Column 16, line 66-67; Change "BPAFLP:molybdenurn(VI)" to --BPAFLP:molybdenum(VI)--.
Column 17, line 17; Change "to PCBA 1 BP and" to --to PCBA1BP and--.
Column 18, line 5; Change "1,6FLPAPm" to --1,6FLPAPrn--.
Column 18, line 7; Change "1,6FLPAPm" to --1,6FLPAPrn--.
Column 18, line 9; Change "1,6FLPAPm" to --1,6FLPAPrn--.
Column 18, line 12; Change "1,6FLPAPm" to --1,6FLPAPrn--.
Column 18, line 15; Change "tion: Alg$_a$) is" to --tion: Alq$_3$) is--.

Signed and Sealed this
Fifteenth Day of October, 2013

Teresa Stanek Rea
*Deputy Director of the United States Patent and Trademark Office*